United States Patent
Liu et al.

(10) Patent No.: US 8,817,435 B2
(45) Date of Patent: Aug. 26, 2014

(54) INTEGRATED ELECTROSTATIC DISCHARGE (ESD) DEVICE

(75) Inventors: Chi Kang Liu, Shanghai (CN); Ta Lee Yu, Shanghai (CN); Quan Li, Shanghai (CN)

(73) Assignee: Semiconductor Manufacturing International (Shanghai) Corp., Shanghai (CN)

( * ) Notice: Subject to any disclaimer, the term of this patent is extended or adjusted under 35 U.S.C. 154(b) by 77 days.

(21) Appl. No.: 13/291,093

(22) Filed: Nov. 7, 2011
(Under 37 CFR 1.47)

(65) Prior Publication Data
US 2012/0115282 A1    May 10, 2012

Related U.S. Application Data

(62) Division of application No. 12/483,195, filed on Jun. 11, 2009, now Pat. No. 8,053,843.

(30) Foreign Application Priority Data

Jul. 15, 2008    (CN) .......................... 2008 1 0040570

(51) Int. Cl.
| | |
|---|---|
| *H02H 9/00* | (2006.01) |
| *H02H 3/20* | (2006.01) |
| *H02H 9/04* | (2006.01) |
| *H01L 27/088* | (2006.01) |
| *H01L 29/76* | (2006.01) |

(52) U.S. Cl.
USPC ............ 361/56; 361/111; 361/91.1; 257/273; 257/370

(58) Field of Classification Search
CPC ........... H02H 3/20; H02H 9/04; H02H 9/046; H05K 1/0257; H05K 1/0259
USPC ..................... 361/56, 111, 93.1; 257/273, 370
See application file for complete search history.

(56) References Cited

U.S. PATENT DOCUMENTS

| | | |
|---|---|---|
| 4,902,639 A | 2/1990 | Ford |
| 4,918,026 A | 4/1990 | Kosiak et al. |

(Continued)

FOREIGN PATENT DOCUMENTS

CN    1913174 A    2/2007

OTHER PUBLICATIONS

"Fujitsu Develops CMOS Logic Based High Voltage Transistor for Power Amplifiers" published by Fujitsu Microelectronics Asia Pte Ltd, at http://www.fujitsu.com/sg/news/pr/fmal_20081229.html.*

(Continued)

*Primary Examiner* — Jared Fureman
*Assistant Examiner* — Lucy Thomas
(74) *Attorney, Agent, or Firm* — Kilpatrick Townsend & Stockton LLP

(57) ABSTRACT

A method for making a semiconductor device includes providing a substrate of a first conductivity type and having a surface region, forming a well region of a second conductivity type and having a first depth in the substrate, adding a gate dielectric layer overlying the surface region, adding a gate layer overlying the gate dielectric layer, forming a first LDD region of the first conductivity type and having a second depth within the well region, forming an emitter region of the second conductivity type within the first LDD region, and forming a second LDD region of the first conductivity type with the well region, a channel region separates the first and second LDD regions. The method further includes forming a source region being of the first conductivity type within the second LDD region and adding an output pad coupled to both the drain and emitter regions.

13 Claims, 7 Drawing Sheets

(56) References Cited

U.S. PATENT DOCUMENTS

| | | | |
|---|---|---|---|
| 5,874,338 A | 2/1999 | Ferla et al. | |
| 5,895,249 A | 4/1999 | Zambrano et al. | |
| 6,228,719 B1 | 5/2001 | Frisina et al. | |
| 6,803,789 B1 | 10/2004 | Yu et al. | |
| 6,873,017 B2 | 3/2005 | Cai et al. | |
| 6,924,531 B2 * | 8/2005 | Chen et al. | 257/336 |
| 6,972,466 B1 | 12/2005 | Liang et al. | |
| 8,053,843 B2 | 11/2011 | Liu et al. | |
| 8,278,710 B2 * | 10/2012 | Khemka et al. | 257/339 |
| 2005/0250289 A1 | 11/2005 | Babcock et al. | |
| 2008/0218922 A1 * | 9/2008 | Mallikararjunaswamy et al. | 361/91.6 |
| 2009/0315145 A1 | 12/2009 | Lin et al. | |

OTHER PUBLICATIONS

Notice of Allowance for U.S. Appl. No. 12/483,195, mailed on Aug. 30, 2011, 7 pages.

Requirement for Restriction/Election for U.S. Appl. No. 12/483,195, mailed on May 17, 2011, 7 pages.

* cited by examiner

INTEGRATED ELECTROSTATIC DISCHARGE (ESD) DEVICE

CROSS-REFERENCE TO RELATED APPLICATIONS

This application is a divisional application of U.S. patent application Ser. No. 12/483,195, filed Jun. 11, 2009, entitled "Integrated Electrostatic Discharge (ESD) Device," the entire content of which is incorporated herein by reference for all purposes. The U.S. application Ser. No. 12/483,195 claims the benefit and priority under 35 U.S.C. 119 of Chinese Patent Application No. 200810040570.8, filed Jul. 15, 2008, entitled "Integrated Electrostatic Discharged Device," by inventors Chi Kang Liu, Ta Lee Yu, and Quan Li, commonly assigned. Both of these applications are commonly owned and incorporated by reference herein for all purposes.

BACKGROUND OF THE INVENTION

The present invention is directed to integrated circuits and their processing for the manufacture of semiconductor devices. More particularly, the invention provides a method and device for an ESD device incorporating a high voltage LDD structure for the manufacture of integrated circuits. The invention provides techniques for an ESD device which has a lower trigger voltage and offers more effective protection to the integrated circuit than conventional devices. Merely by way of example, the invention has been applied to ESD protection of high voltage I/O circuit for the manufacture of integrated circuits. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is electrostatic discharge (ESD) protection devices used for the manufacture of integrated circuits in a cost effective and efficient way.

Fabrication of custom integrated circuits using chip foundry services has evolved over the years. Fabless chip companies often design the custom integrated circuits. Such custom integrated circuits require a set of custom masks commonly called "reticles" to be manufactured. A chip foundry company called Semiconductor Manufacturing International Company (SMIC) of Shanghai, China is an example of a chip company that performs foundry services. Although many ESD protection circuits and methods are provided by fabless chip companies and foundry services, inherent limitations still exist. For example, in a high voltage process, it is difficult to fabricate efficient electrostatic discharge (ESD) bipolar junction transistor (BJT) devices. Because in a high voltage process deep N-type and P-type wells are used. Conventional ESD bipolar devices built in these deep wells cannot be easily triggered by high voltage pulses caused by ESD events. Conventional high voltage ESD devices which include simple N+/P-well or P+/N-well diodes suffer from large areas and poor ESD performance.

FIG. 1 is a cross-sectional view diagram of a conventional bipolar ESD clamp device. As shown ESD clamp device 100 includes a bipolar transistor 140 formed with P-type double diffused drain (DDD) 130, high-voltage N-well 120, and P-type substrate 110. To provide device protection, an ESD bipolar transistor needs to trigger at a moderate voltage, for example 10-15 volts for some applications. Then a large current is allowed to flow through the bipolar transistor at a substantially reduced voltage, thus avoiding damages to other devices in the integrated circuit. In the conventional ESD clamp device shown in FIG. 1, the base width of bipolar transistor 140, which is determined by a depth of the HV N-well region 120 in FIG. 1, can be as large as 3 um. Therefore it would take a very high voltage for the bipolar transistor to trigger. As a result ESD protection is only provided by a diode junction breakdown in bipolar transistor 140. When operation voltage is higher than the junction breakdown voltage, for example, 30V, the energy of junction break down during the ESD pulse, which can be expressed as a product of voltage and current (V*I), can be very large. FIG. 2 is a simplified drawing of a current-voltage curve during a junction breakdown of a conventional bipolar ESD clamp device. Large devices are therefore needed to increase ESD junction area to avoid junction burnout. These and other limitations are described throughout the present specification and more particularly below.

From the above, it is seen that an improved technique for processing semiconductor devices is desired.

BRIEF SUMMARY OF THE INVENTION

According to an embodiment of the present invention techniques are provided for integrated circuits and their processing. More particularly, the invention provides a method and device for an ESD device incorporating a high voltage LDD structure for the manufacture of integrated circuits. The invention provides techniques for an ESD device which has a lower trigger voltage and offers more effective protection to the integrated circuit than conventional devices. Merely by way of example, the invention has been applied to ESD protection of high voltage I/O circuit for the manufacture of integrated circuits. But it would be recognized that the invention has a much broader range of applicability.

In a specific embodiment, the invention provides semiconductor device including a semiconductor substrate comprising a surface region and a well region within the semiconductor substrate. The semiconductor substrate is characterized by a first conductivity type, and the well region is characterized by a second conductivity type. The well region is also characterized by a first depth. The device includes a first lightly-doped-drain (LDD) region within the well region. The first LDD region is of the first conductivity type and is characterized by a second depth. The device also includes an emitter region within the first LDD region. The emitter region is characterized by the second conductivity type. The device includes a drain region of the first conductivity type within the first LDD region, and a second lightly-doped-drain (LDD)

region of the first conductivity type within the well region. The second LDD region is separated from the first LDD region by a channel region. The device further includes a source region of the first conductivity type within the second LDD region. The device also includes gate dielectric overlying the surface region, and a gate layer overlying the gate dielectric layer. The device also includes an output terminal coupled to both the drain region and the emitter region. The first LDD region, the well region, and the substrate are associated with a first bipolar transistor, which is characterized by a first trigger voltage. The emitter region, the first LDD region, and the well region are associated with a second bipolar transistor, which is characterized by a second trigger voltage. In an embodiment, the semiconductor substrate is a silicon based semiconductor substrate. In an embodiment, the first lightly-doped-drain (LDD) region is a high-voltage LDD region (HV-LDD). In a specific embodiment, the first conductivity type is P-type and the second conductivity type is N-type. In another embodiment, the first conductivity type is N-type and the second conductivity type is P-type. In an embodiment, the first depth and second depth are selected such that the first trigger voltage and the second trigger voltage are less than a predetermined voltage. In an embodiment, the first depth is approximately 3 um, whereas the second depth is approximately 0.5-1.5 um. In another embodiment, the second depth is approximately one half of the first depth. In some embodiment, the first trigger voltage is less than 30 volts, whereas in other embodiment, the first trigger voltage is approximately 10 volts. In an embodiment, the second trigger voltage is less than 30 volts. In another embodiment, the second trigger voltage can be approximately 10 volts. In a specific embodiment, the second LDD region is characterized by a third depth, and the third depth is less than the second depth.

In another embodiment, the invention provides a semiconductor device for ESD protection that includes a semiconductor substrate of a first conductivity type and a well region of a second conductivity type formed within the substrate. The well region is characterized by a first depth. An MOS transistor includes a first lightly doped drain (LDD) region of a second depth within the well region, and a drain region and an emitter region within in the first LDD region. The emitter region is characterized by a second conductivity type. A first bipolar transistor is associated with the emitter region, the first LDD region, and the well region, and is characterized by a first trigger voltage. A second bipolar transistor is associated with the first LDD region, the well region, and the substrate, and is characterized by a second trigger voltage. The first depth and second depth are selected such that the first trigger voltage and the second trigger voltage are less than a predetermined voltage. In an embodiment, the first lightly-doped-drain (LDD) region is a high-voltage LDD region (HV-LDD).

In another embodiment the invention provides a bipolar ESD clamp apparatus for the manufacture of integrated circuits. The apparatus includes a p-type silicon substrate which includes a surface region. The apparatus also includes an N-well region within the substrate, the N-well region being characterized by a first depth. The apparatus includes a p-type high-voltage lightly-doped-drain (LDD) within the N-well region, an N+ region within the high voltage LDD region, and a P+ region within the high voltage LDD region. The N+ region and the P+ region are connected to a pad structure. In an embodiment, the high voltage LDD region, the N-well region, and the substrate are associated with a first bipolar transistor characterized by a first trigger voltage, and the N+ region, the high voltage LDD region, and the N-well region are associated with a second bipolar transistor characterized by a second trigger voltage. In an embodiment, the first depth and second depth are selected such that the first trigger voltage and the second trigger voltage are less than a predetermined voltage. In a specific embodiment, the first trigger voltage is less than about 30 volts and the second trigger voltage is less than about 30 volts. In another embodiment, the first trigger voltage is approximately 10 volts and the second trigger voltage is approximately 10 volts. In an embodiment, the high voltage LDD region is characterized by a first depth that is approximately one half of a depth of the N-well region.

In an alternative embodiment, a method is provided for making a semiconductor device. The method includes providing a semiconductor substrate comprising a surface region. The semiconductor substrate is characterized by a first conductivity type. The method includes forming a well region of a second conductivity type within the semiconductor substrate. The well region is also characterized by a first depth. The method also includes adding a gate dielectric layer overlying the surface region, and adding a gate layer overlying the gate dielectric layer. The method further includes forming a first lightly-doped-drain (LDD) region within the well region, the first LDD region being of the first conductivity type and characterized by a second depth. The method includes forming an emitter region of the second conductivity type within the first LDD region. The method also forms a drain region of the first conductivity type within the first LDD region. The method also forms a second lightly-doped-drain (LDD) region of the first conductivity type within the well region. The second LDD region is separated from the first LDD region by a channel region. The method includes forming a source region of the first conductivity type within the second LDD region. The method then adds an output pad coupled to both the drain region and the emitter region. In an embodiment, the first LDD region, the well region, and the substrate are associated with a first bipolar transistor characterized by a first trigger voltage. The emitter region, the first LDD region, and the well region are associated with a second bipolar transistor characterized by a second trigger voltage. In an embodiment the first conductivity type is P-type and the second conductivity type is N-type. In an embodiment the first depth and second depth are selected such that the first trigger voltage and the second trigger voltage are less than a predetermined voltage.

Many benefits are achieved by way of the present invention over conventional techniques. For example, the present technique provides an easy to use process that relies upon conventional technology. In some embodiments, the invention provides a method for achieving low trigger voltage and effective device protection against high voltage ESD events. Additionally, the method provides a process that is compatible with conventional process technology without substantial modifications to conventional equipment and processes.

Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

According to embodiments of the present invention techniques are provided for integrated circuits and their processing. More particularly, the invention provides a method and device for an ESD device incorporating a high voltage LDD structure for the manufacture of integrated circuits. The invention provides techniques for an ESD device which has a lower trigger voltage and offers more effective protection to the integrated circuit than conventional techniques. Merely by way of example, the invention has been applied to ESD protection of high voltage I/O circuit for the manufacture of integrated circuits. But it would be recognized that the invention has a much broader range of applicability.

Depending upon the embodiment, the present invention includes various features, which may be used. These features include the following:

1. An ESD protection device having low trigger voltage and offering more effective protection of the integrated circuit than conventional devices.
2. A method for forming a high voltage I/O transistor having an integrated ESD protection device.
3. A method for forming high voltage NMOS and PMOS I/O transistors having embedded ESD protection devices.

As shown, the above features may be in one or more of the embodiments to follow. These features are merely examples, which should not unduly limit the scope of the claims herein. One of ordinary skill in the art would recognize many variations, modifications, and alternatives.

Figure 3:
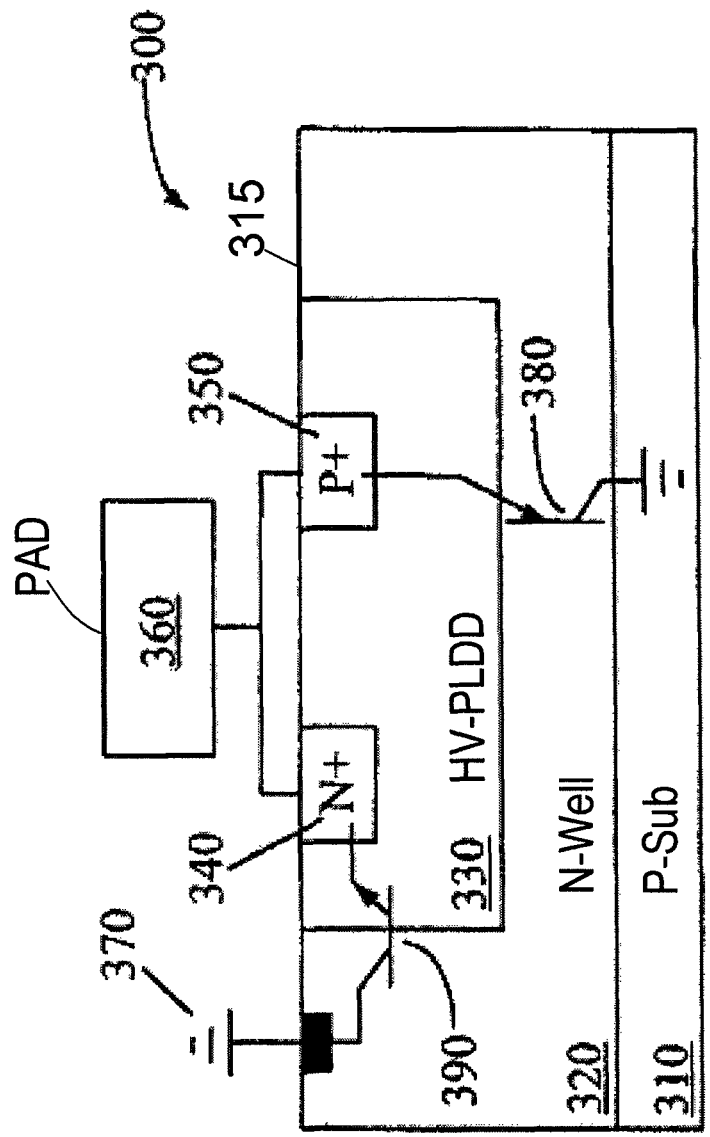
FIG. 3 is a simplified cross-sectional view diagram of an ESD clamp device according to an embodiment of the present invention.

FIG. 3 is a simplified cross-sectional view diagram of an ESD clamp device 300 according to an embodiment of the present invention. This diagrams is merely an example, which should not unduly limit the scope of the claims herein. One of ordinary skill in the art would recognize many variations, alternatives, and modifications. As shown, ESD clamp device 300 includes P-type substrate 310 having a surface region 315, and an N-type well region 320 formed within the P-type substrate 310. In an embodiment, N-type well region 320 has a depth of about 2-3 um. ESD clamp device 300 also includes a high voltage PLDD region (HV-PLDD) 330 formed within N-well region 320. In an embodiment, HV-PLDD region 330 has a depth of, e.g., approximately 0.5-1.5 um and is doped with P-type impurities such as boron or boron-containing impurities to a concentration of e.g., approximately 1E16 to 1E17/cm$^3$. These depth and concentration values are merely examples, which should not unduly limit the scope of the claims herein. One of ordinary skill in the art would recognize many variations and modifications according to specific applications. ESD clamp device 300 further includes N+ region 340 and P+ region 350 formed within the HV-PLDD region 330. The N+ regions 340 is heavily doped with N-type impurities such as arsenic or phosphorus to a concentration of e.g. approximately 1E18 to 1E19/cm$^3$, depending on specific applications. P+ regions 350 is heavily doped with P-type impurities such as boron or boron-containing impurities to a concentration of e.g. approximately 1E18 to 1E19/cm$^3$, depending on specific applications. As shown in FIG. 3, ESD clamp device 300 includes a pad region 360 which is schematically shown to be electrically connected to N+ region 340 and P+ region 350. A contact in N-well is also provided to be electrically connected to a ground 370. Depending upon the embodiment, one of ordinary skill in the art would recognize other variations, modifications, and alternatives.

Figure 1:
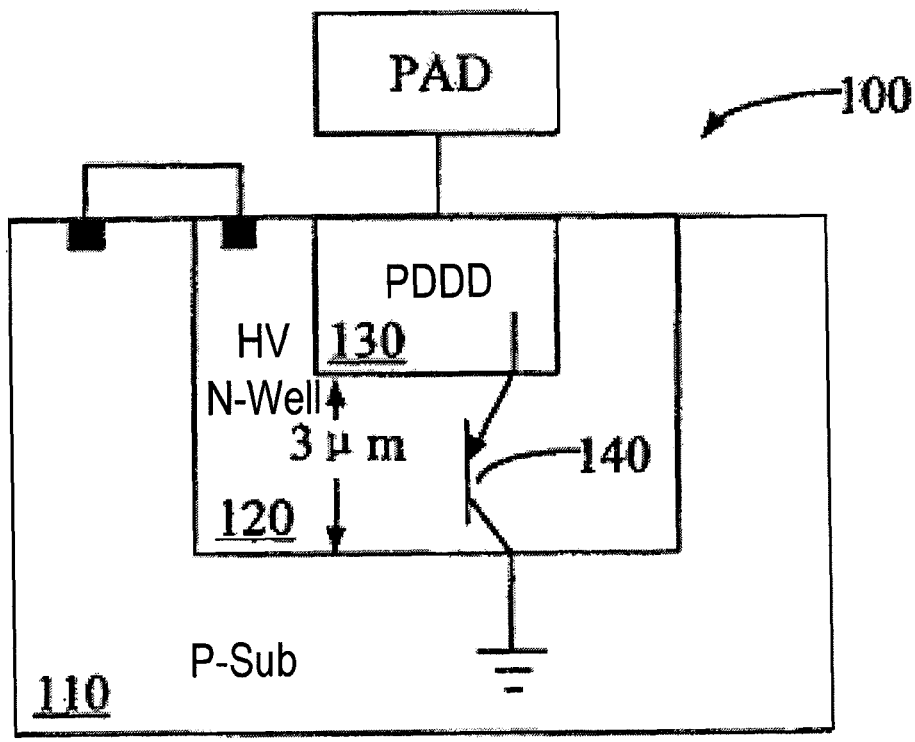
FIG. 1 is a cross-sectional view diagram of a conventional bipolar ESD clamp device.
Figure 2:
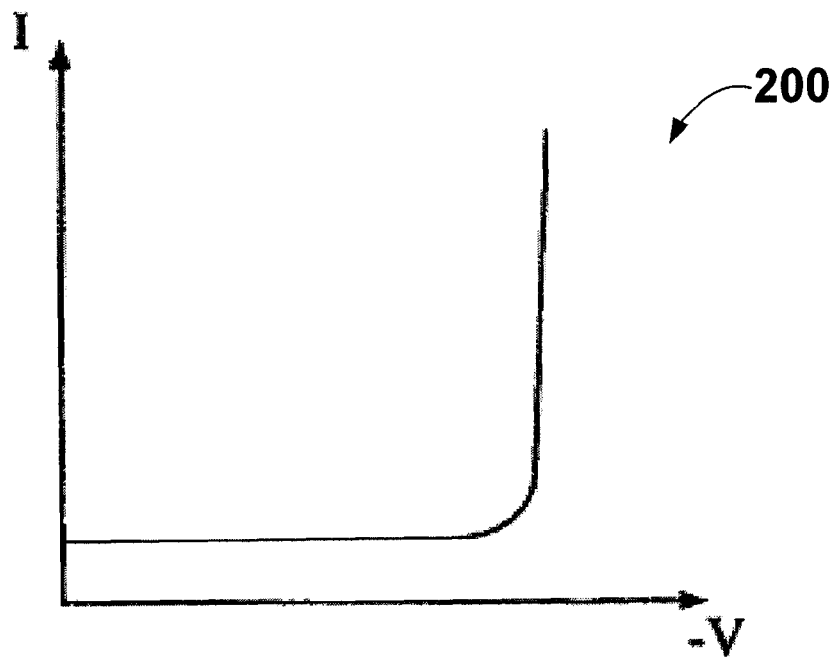
FIG. 2 is a simplified drawing of a current-voltage curve showing a junction breakdown of a conventional bipolar ESD clamp device.

Referring to FIG. 3, two bipolar transistor structures are formed in ESD clamp device 300. As shown schematically, PNP bipolar transistor 380 includes an emitter (P+ region 350 and HV-PLDD region 330), a base (N-well 380), and a collector (P-sub 310). Compared with the conventional ESD device in FIG. 1, PNP transistor 380 has a shorter base width in N-well region 320, because the HV-PLDD region 330 extends the emitter region and shortens the base region. Base width of bipolar transistor can be selected by adjusting a depth of N-well region 320 and a depth of HV-PLDD region 330. PNP transistor 380 can therefore be triggered by a lower voltage of, for example, 10-15 volts, whereas a conventional device may have a trigger voltage higher than 30 volts. Therefore PNP transistor 380 can provide better protection against ESD events which raise a negative high voltage at PAD 360.

Also shown schematically in FIG. 3 is an NPN bipolar transistor 390 which includes an emitter (N+ region 340), a base (HV-PLDD 330), and a collector (N-well 320). NPN bipolar transistor 390 can be triggered at a predetermined trigger voltage and offer protection against ESD events which present a positive high voltage at PAD 360. The base width of NPN bipolar transistor 390 is determined by a depth of the HV_PLDD region. According to embodiments of the invention, the depth of HV-PLDD region 330 is chosen to be more than that of conventional P-type LDD region for logic transistors. As mentioned earlier, the depth of HV-PLDD region 330 also affects the base width of PNP transistor 380. The doping concentration and depth of the HV-PLDD region are chosen to provide appropriate width and doping concentration of bipolar transistor base regions, which are design parameters selected to optimize trigger voltages for both PNP transistor 380 and NPN transistor 390. In a specific embodiment, HV-PLDD region 330 has a depth of approximately 0.5-1.5 um and is doped with P-type impurities such as boron or boron-containing impurities to a concentration of approximately 1E16 to 1E17/cm$^3$. These design parameters are merely examples, which should not unduly limit the scope of the claims herein. One of ordinary skill in the art would recognize many variations and modifications according to specific applications.

Figure 4:
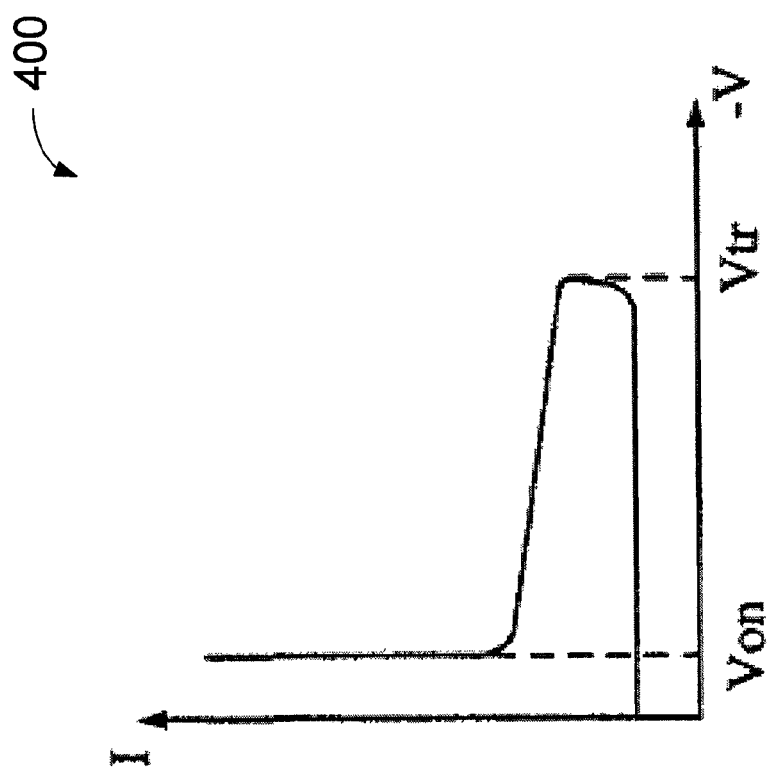
FIG. 4 is a simplified drawing of a current-voltage curve showing a snapback of bipolar ESD device according to an embodiment of the present invention.

FIG. 4 is a simplified drawing of a current-voltage curve showing a snapback of a bipolar ESD device, such as device 300 in FIG. 3, according to an embodiment of the present invention. As shown, when an external ESD high voltage reaches a trigger voltage Vtr, for example, 10-15 volts, a bipolar transistor in the ESD clamp device 300 is triggered, allowing current to flow at a safe voltage level Von, for example, 1-2 volts. Depending on the polarity of the ESD voltage, either PNP transistor 380 or NPN transistor 390 can be triggered. These design parameters are merely examples, which should not unduly limit the scope of the claims herein. One of ordinary skill in the art would recognize many variations and modifications according to specific applications.

Figure 5:
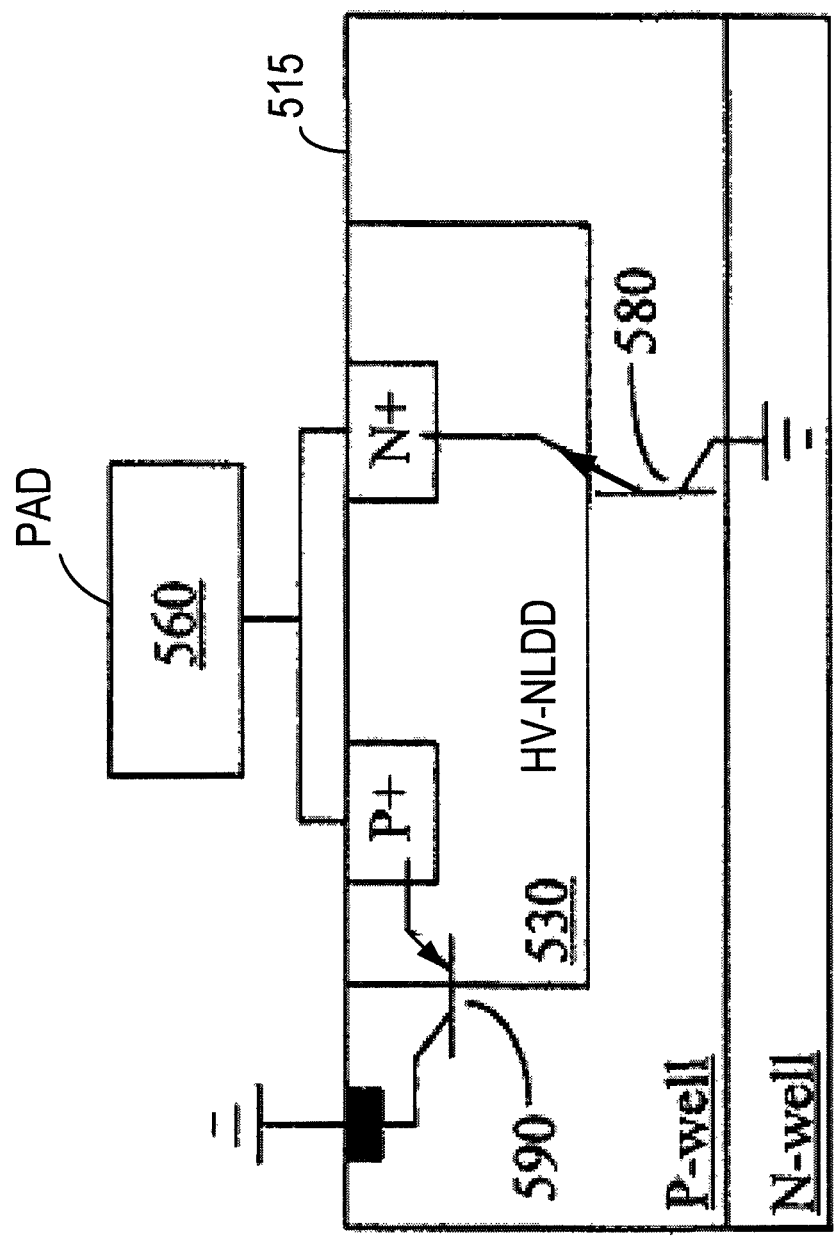
FIG. 5 is a simplified cross-sectional view diagram of an ESD clamp device according to another embodiment of the present invention.

FIG. 5 is a simplified cross-sectional view diagram of an ESD clamp device according to another embodiment of the present invention. FIG. 5 shows an ESD clamp device similar to device 300 in FIG. 3, but having reversed polarities, i.e., with N-type and P-type conductivities interchanged. Specifically, a high voltage NLDD (HV-NLDD) region 530 is used instead of HV-PLDD region 330 in FIG. 3. Various other components in FIG. 5 have their counterparts in FIG. 3. For example, NPN transistor 580 is triggered by a negative high voltage at PAD 560, and PNP transistor 590 is triggered by a negative high voltage at PAD 560. According to embodiments of the invention, the doping concentration and depth of the HV-NLDD region 530 are chosen to provide appropriate width and doping concentration of the base regions, which are design parameters selected to optimize the trigger voltages for both PNP transistor 590 and NPN transistor 580. In a specific embodiment, HV-NLDD region 530 has a depth of approximately 0.5-1.5 um and is doped with P-type impurities such as boron or boron-containing impurities to a concentration of approximately 1E16 to 1E17/cm$^3$. In a specific embodiment, the P-well region is about 2-3 um thick. These design parameters are merely examples, which should not unduly limit the scope of the claims herein. One of ordinary skills in the art would recognize many variations and modifications according to specific applications.

Figure 6:
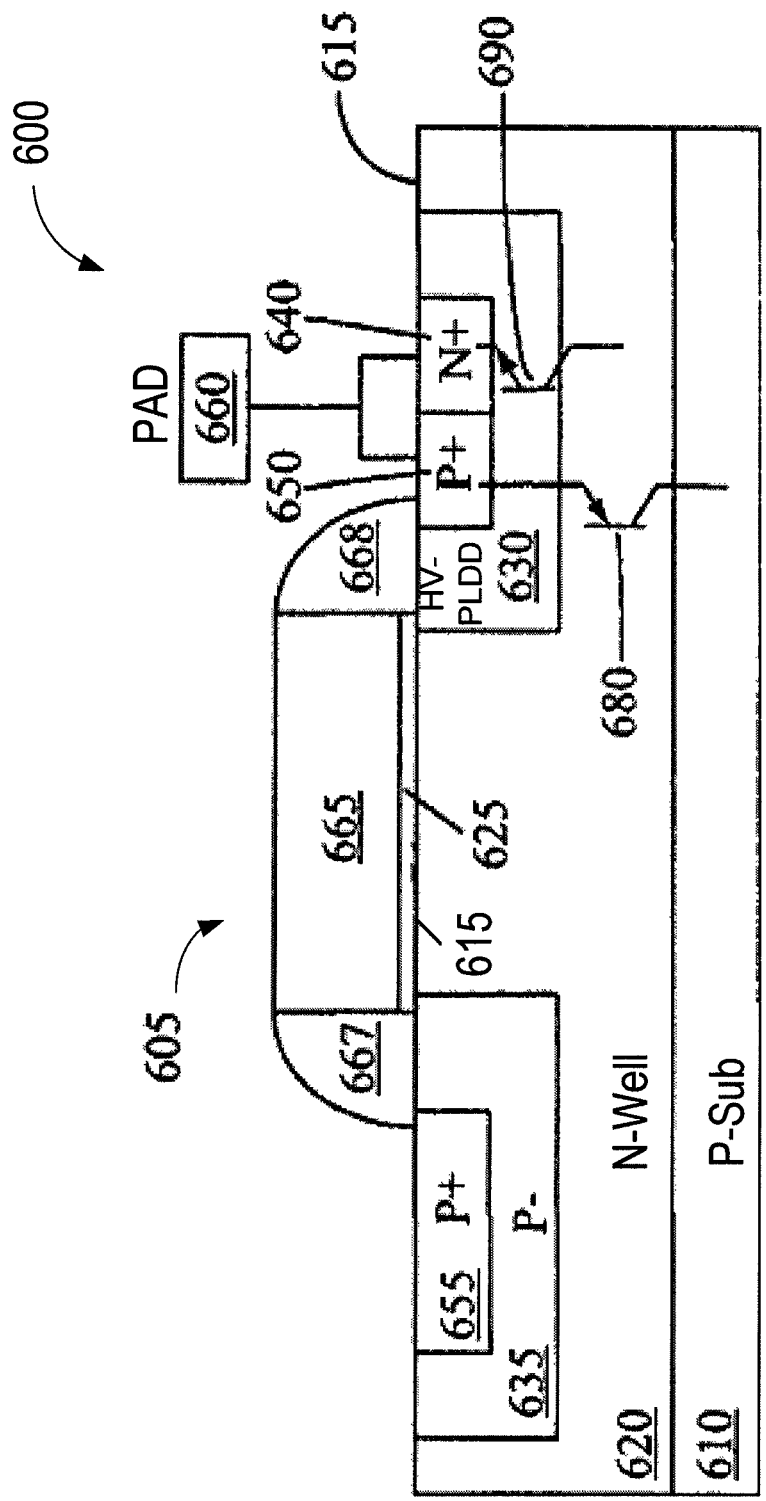
FIG. 6 is a simplified cross-sectional view diagram of a transistor integrated with a bipolar ESD clamp device according to an embodiment of the present invention.

FIG. 6 is a simplified cross-sectional view diagram of a transistor device 600 integrated with a bipolar ESD clamp device according to an embodiment of the present invention. This diagrams is merely an example, which should not unduly limit the scope of the claims herein. One of ordinary skill in the art would recognize many variations, alternatives, and modifications. As shown, transistor device 600 includes P-type substrate 610 having a surface region 615, and an N-type well region 620 formed within the P-type substrate 610. In an embodiment, the N-well region has a depth of about 3 um. Transistor device 600 also includes a high voltage PLDD region (HV-PLDD) 630 formed within N-well region 620. HV-PLDD region 630 has a depth of, for example, approximately 0.5-1.5 um and is doped with P-type impurities such as boron or boron-containing impurities to a concentration of, for example, approximately 1E16 to 1E17/cm$^3$. These depth and concentration values are merely examples, which should not unduly limit the scope of the claims herein. One of ordinary skills in the art would recognize many variations and modifications according to specific applications. Transistor device 600 also includes P-type region 635, which has substantially the same depth and doping concentration as HV-PLDD region 630 according to an embodiment of the invention. In other embodiments, P-type region 635 can have different depths and doping concentrations, depending upon specific applications. Transistor device 600 further includes N+ region 640 and P+ region 650 formed within the HV-PLDD region 630, and P+ region 655 formed in P− region 635. The N+ regions 640 is heavily doped with N-type impurities such as arsenic or phosphorus to a concentration of approximately 1E18 to 1E19/cm$^3$, depending on specific applications. P+ regions 650 and 655 are heavily doped with P-type impurities such as boron or boron-containing impurities to a concentration of approximately 1E18 to 1E19/cm$^3$, depending on specific applications. These design parameters are merely examples, which should not unduly limit the scope of the claims herein. One of ordinary skill in the art would recognize many variations and modifications according to specific applications.

Referring to FIG. 6, transistor device 600 includes an ESD clamp structure similar to device 300 in FIG. 3. For example, PNP transistor 680 includes an emitter (P+ region 650 and HV-PLDD region 630), a base (N-well 620), and a collector (P-sub 610). NPN bipolar transistor 690 includes an emitter (N+ region 640), a base (HV-PLDD 630), and a collector (N-well 620). PAD 660 is electrically connected to the emitter regions of PNP transistor 680 and NPN transistor 690. Together PNP bipolar transistor 680 and NPN bipolar transistor 690 are triggered by high voltages caused by ESD events and provide a current path to protect devices in the integrated circuit. An example of such device is a PMOS transistor 605 included in transistor device 600.

As shown in FIG. 6, transistor device 600 further includes gate oxide layer 625 overlying a surface region 615 of N-well region 620, a polysilicon gate 665 overlying gate oxide layer 625, and spacer regions 667 and 668. As shown, PMOS transistor 605 includes a drain region (P+ regions 650), source region (P+ region 655), and a substrate (N-well region 620), in addition to gate 665, gate oxide 625, and channel region 615. Depending on applications, drain region (P+ regions 650) and source region (P+ region 655) can be interchanged, such that P+ regions 650 is operated as a source region and P+ region 655 is operated as a drain region. PMOS transistor 605 also includes spacers 667 and 668, and LDD regions 635 and 630. Transistor 605 can be used as a high voltage I/O device, embedded with ESD clamp devices 680 and 690. A high voltage at PAD 660 caused by an ESD event will be diverted by ESD clamp devices 680 and 690, thus protecting PMOS transistor 605 from ESD damages. Depending upon the embodiment, one of ordinary skill in the art would recognize other variations, modifications, and alternatives.

Referring to FIG. 6, HV-PLDD region 630 extends the emitter region of PNP transistor 680 and shortens its base region. PNP transistor 680 can therefore be triggered by a lower voltage such as 10-15 volts, and offers better protection against ESD events which presents a negative high voltage at the pad 660. NPN bipolar transistor 690 has a base width determined by the depth of HV-PLDD region 630. NPN bipolar transistor 690 can be triggered by a positive ESD high voltage at the pad 660 and offers protection against such ESD events. According to embodiments of the invention, the doping concentration and depth of the HV-PLDD region 630 are chosen to provide appropriate width and doping concentration of the base regions of bipolar transistors 680 and 690. These design parameters are selected to optimize the trigger voltages for both PNP transistor 680 and NPN transistor 690. In a specific embodiment, HV-PLDD region 630 has a depth of approximately 0.5-1.5 um and is doped with P-type impurities such as boron or boron-containing impurities to a concentration of approximately 1E16 to 1E17/cm$^3$. These design parameters are merely examples, which should not unduly limit the scope of the claims herein. One of ordinary skill in the art would recognize many variations and modifications according to specific applications.

Figure 7:
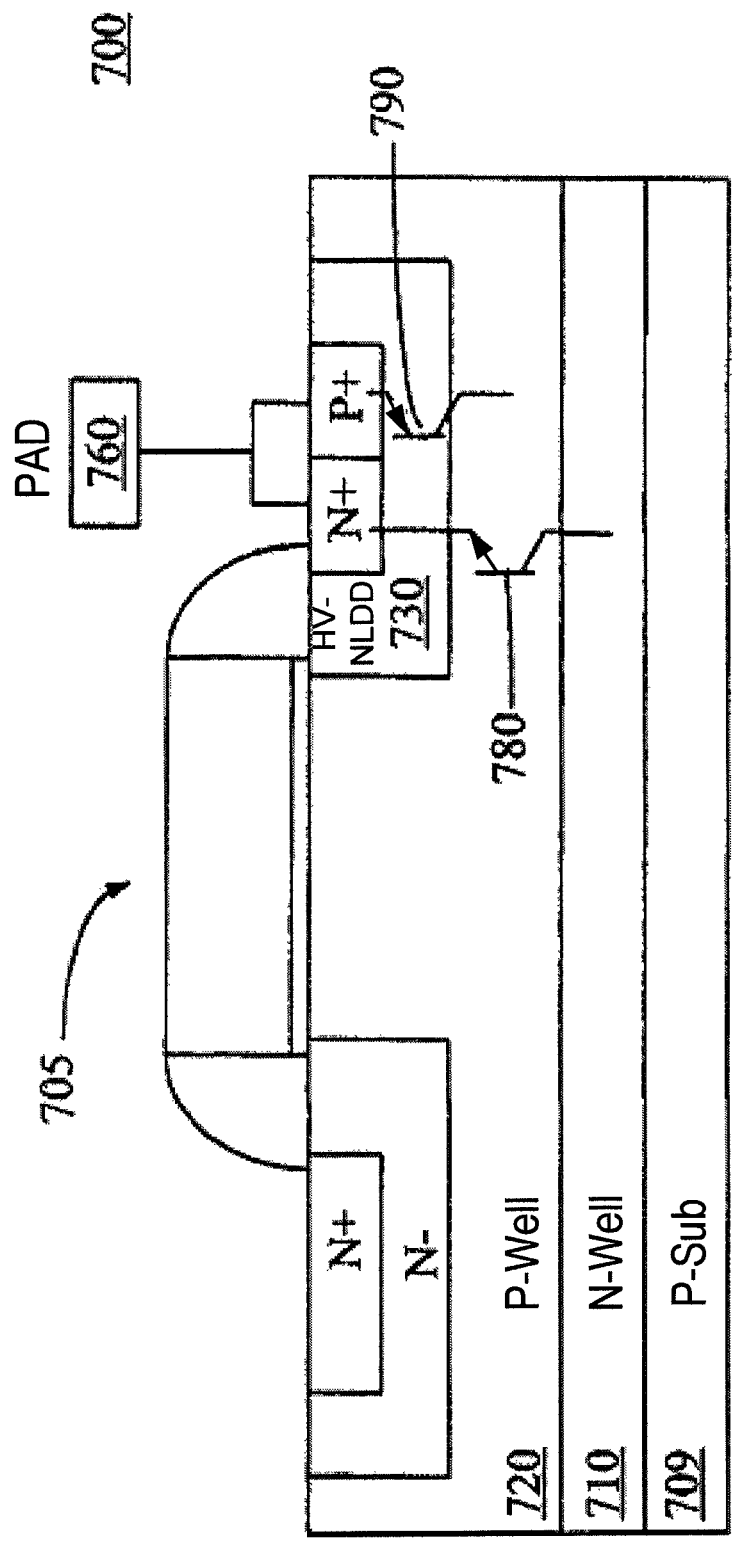
FIG. 7 is a simplified cross-sectional view diagram of a transistor integrated with a bipolar ESD clamp device according to an alternative embodiment of the present invention.

FIG. 7 is a simplified cross-sectional view diagram of a transistor incorporated with a bipolar ESD clamp device according to an alternative embodiment of the present invention. In FIG. 7, device 700 includes NMOS transistor 705 with an embedded ESD clamp device, similar to device 600 in FIG. 6, but having reversed polarities, i.e., with N-type and P-type conductivities interchanged. For example, a high voltage NLDD (HV-NLDD) region 730 is used instead of HV-PLDD region 630 in FIG. 6. N-well region 710 is formed within P-type substrate 709. Alternatively, N-well region can be replaced by an N-type substrate. Various other components in FIG. 7 have their counterparts in FIG. 6. For example, NPN transistor 780 is triggered by a positive high voltage at PAD 760, and PNP transistor 790 is triggered by a negative high voltage at PAD 760. According to embodiments of the invention, the doping concentration and depth of the HV-NLDD region 730 are chosen to provide appropriate width and doping concentration of the base regions, which are design parameters selected to optimize the trigger voltages for both PNP transistor 790 and NPN transistor 780. In a specific embodiment, P-well region 720 has a depth of approximately 2-3 um. HV-NLDD region 730 has a depth of approximately 0.5-1.5 um and is doped with N-type impurities with a concentration of approximately 1E16 to 1E17/cm$^3$. These design parameters are merely examples, which should not unduly limit the scope of the claims herein. One of ordinary skill in the art would recognize many variations and modifications according to specific applications.

A method for fabricating an integrated circuit device according to an embodiment of the present invention may be outlined as follows:

1. Provide a substrate, e.g., silicon wafer;
2. Form well regions including at least an N-well region;
3. Form gate oxide region;
4. Form polysilicon layer for transistors;
5. Form lightly doped drain regions;
6. Form spacer region on sides of the polysilicon gates;
7. Form the source and drain of the logic transistors.
8. Form an emitter region for the ESD clamp device;
9. Perform backend processing including interlayer dielectrics, metal, and contacts.

The above sequence of steps provides a method according to an embodiment of the present invention. As shown, the method uses a combination of steps including a way of forming a high voltage LDD region for an ESD protection device according to embodiments of the present invention. Other alternatives can also be provided where steps are added, one or more steps are removed, or one or more steps are provided in a different sequence without departing from the scope of the claims herein. Further details of the present method can be found throughout the present specification and more particularly below.

Figure 8:
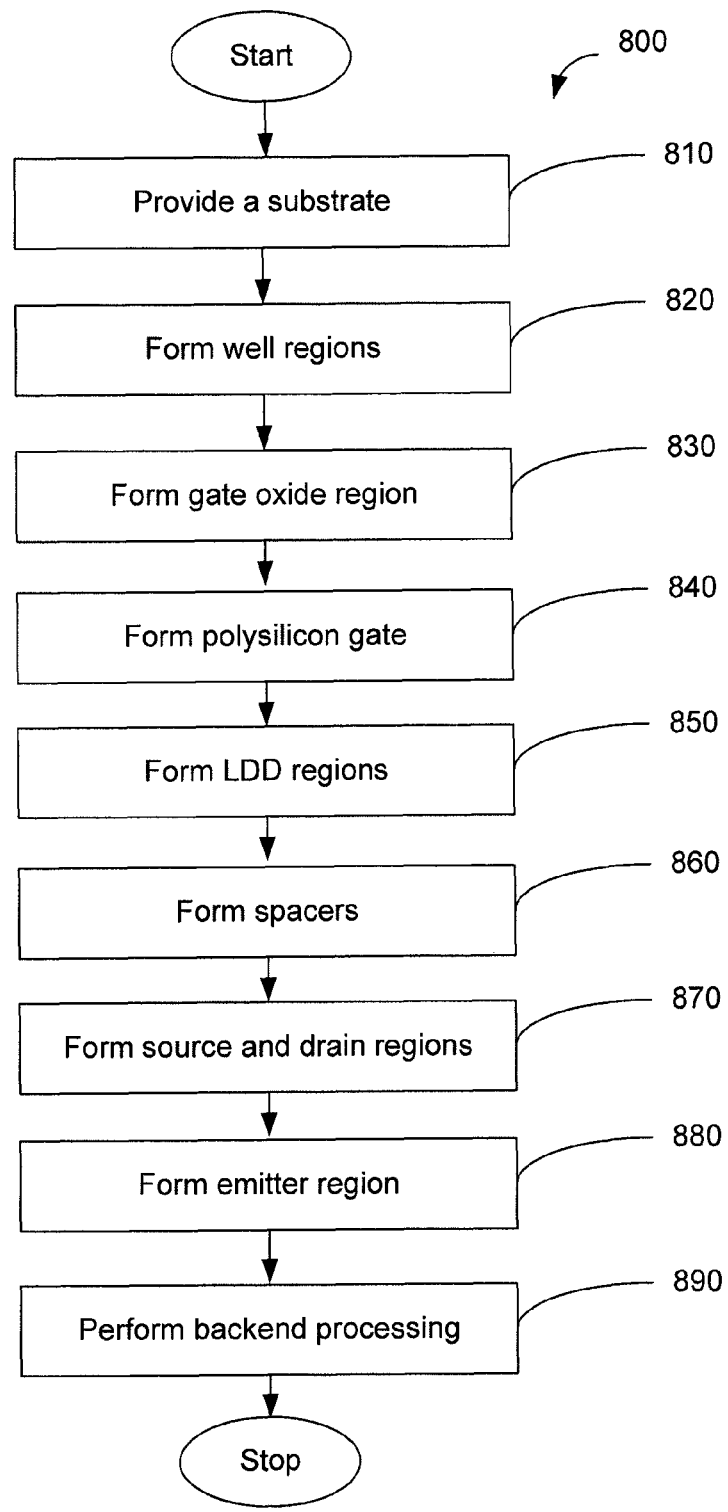
FIG. 8 is a simplified flow chart of a method for making a transistor device with integrated ESD clamp device according to an embodiment of the present invention.

FIG. 8 is a simplified flow chart of a method for making a transistor device with an integrated ESD clamp device according to an embodiment of the present invention. This flowchart is merely an example, which should not unduly limit the scope of the claims herein. Referring to the flowchart in FIG. 8, the method includes step 810 for providing a substrate (e.g., silicon wafer) comprising a surface region. In step 820, the method includes forming adequate well structures within the substrate. The well structures include an N-well region for a PMOS device. In a specific embodiment, the N-well region has a depth of approximately 2-3 um. In other embodiments, the depth can be adjusted for different applications. Alternatively, a P-well can be formed for an NMOS device. A P-well region includes boron based impurities or the like, and an N-well region includes N-type dopants such as phosphorus or arsenic based impurities. In step 830, the method includes forming a gate dielectric layer (e.g., gate oxide, nitride, silicon oxynitride) overlying the surface region, which extends over the well region as shown. The gate dielectric is often formed using a thermal oxidation process to form high quality gate oxide, which is substantially free from voids. Proper gate dielectric layer depths are often required for devices to operate at different voltages. Depending upon the embodiment, there can be other variations, modifications, and alternatives.

Referring to FIG. 8, the method in step 840 includes forming a polysilicon film overlying the gate dielectric layer. The polysilicon film is often doped using impurities to provide conductive characteristics. The film can be doped using diffusion and/or in-situ doping techniques of phosphorus bearing impurities, e.g., phosphine. For PMOS devices, boron-containing impurities, such as diborine can be used. The film can be a single layer or multiple layers of different materials, depending upon the embodiment. The polysilicon film is then patterned to form gate electrodes for MOS transistors.

In step 850, the method includes forming high voltage lightly doped drain ("HV-LDD") structures for each of the transistors. Photoresist masks are used to allow implanting N-type impurities into NMOS regions and implanting P-type impurities into PMOS regions. In preferred embodiments, HV-LDD regions are provided to withstand high operating voltages. As a result, they are often deeper than conventional LDD implants used in logic devices. In a specific embodiment, HV-LDD region has a depth of approximately 0.5-1.5 um and is doped with impurities to a concentration of approximately 1E16 to 1E17/cm$^3$. Also in step 850, low voltage lightly doped drain (LV-LDD) regions may also be formed with the well region. The LV-LDD regions are provided to reduce the short-channel effect. These design parameters are merely examples, which should not unduly limit the scope of the claims herein. In some embodiments, the polysilicon gates are used as a mask during the HV-LDD implant steps. In other embodiments, HV-LDD implant can be performed before polysilicon gate formation. Here, a photoresist mask can be used to define HV-LDD regions, and then polysilicon gates can be patterned and aligned to the HV-LDD regions.

In some embodiments, the HV-LDD is formed on both sides of the channel, i.e., on both the drain side and the source side. In other embodiments, the HV-LDD is formed on the drain side of the device, and a source side LDD region can be formed using similar masking and implant steps. The source side LDD is similar to conventional LDD region in logic MOS or CMOS device, having shallower junction and may be implanted with a lower dose and lower energy than the HV-LDD. One of ordinary skill in the art would recognize many variations and modifications according to specific applications.

After the HV-LDD implant, a dielectric layer (e.g., oxide) is deposited and etched back to form spacers (step 860). After spacer formation, transistor source/drain (S/D) formation processes are performed (step 870). Here photoresist masks are used to allow N-type impurities to be implanted into NMOS regions and P-type impurities into PMOS regions. The S/D implant uses a dose of impurities ranging from about 3E15 atoms/centimeter$^2$ to about 5E15 atoms/centimeter$^2$ according to preferred embodiments. According to embodiments of the invention, an emitter region for an ESD clamp device is then formed in step 880. Here, a photoresist mask is used to define an emitter region in HV-LDD region, and ion implantation is then performed to dope the emitter region with impurities of a conductivity type opposite to that of a source or drain region of the transistor. For example, an N+ emitter region is formed in a PMOS transistor, and a P+ emitter is formed in an NMOS transistor. As discussed earlier, the emitter region will become part of a bipolar transistor ESD clamp device.

In step 890, typical backend processes are performed. Here, the method includes forming interlayer dielectrics, conductor layers, and contact structures. In an embodiment, contacts are provided to pad regions of the integrated circuit. Examples of resulting device structures of a transistor having an integrated ESD clamp device are shown in FIGS. 6 and 7 and discussed earlier. Of course, one of ordinary skill in the art would recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for making a semiconductor device, the method comprising:
   providing a semiconductor substrate comprising a surface region, the semiconductor substrate being characterized by a first conductivity type;
   forming a well region within the semiconductor substrate, the well region being characterized by a second conductivity type, the well region being also characterized by a first depth;
   adding a gate dielectric layer overlying the surface region;
   adding a gate layer overlying the gate dielectric layer;
   forming a first lightly-doped-drain (LDD) region within the well region, the first LDD region being of the first conductivity type, the first LDD region being characterized by a second depth;
   forming an emitter region within the first LDD region, the emitter region being characterized by the second conductivity type;
   forming a drain region within the first LDD region, the drain region being characterized by the first conductivity type;
   forming a second lightly-doped-drain (LDD) region of the first conductivity type within the well region, the second LDD region being separated from the first LDD region by a channel region;
   forming a source region within the second LDD region, the source region being characterized by the first conductivity type; and
   adding an output pad coupled to both the drain region and the emitter region;
   wherein the first LDD region, the well region, and the substrate are associated with a first bipolar transistor, the first bipolar transistor being characterized by a first trigger voltage, and
   wherein the emitter region, the first LDD region, and the well region are associated with a second bipolar transistor, the second bipolar transistor being characterized by a second trigger voltage.

2. The method of claim 1, wherein the first conductivity type is P-type and the second conductivity type is N-type.

3. The method of claim 1, wherein the first depth and second depth are selected such that the first trigger voltage and the second trigger voltage are less than a predetermined voltage.

4. The method of claim 1, wherein the predetermined voltage is less than about 30 volts.

5. The method of claim 1, wherein the predetermined voltage is approximately 10 volts.

6. The method of claim 1, wherein the first depth is in a range between 2 um and 3 um.

7. The method of claim 1, wherein the second depth is in a range between 0.5 um and 1.5 um.

8. The method of claim 1, wherein the second depth is about one half of the first depth.

9. The method of claim 1, wherein the first LDD has a p-type impurity with a concentration ranging from 1E16 to 1E17 atoms/cm$^3$.

10. The method of claim 1, wherein the well region is contiguous with the first and second LDD regions.

11. The method of claim 1, wherein the emitter region has an N-type impurity with a concentration ranging from 1E18 to 1E19 atoms/cm$^3$.

12. The method of claim 1, wherein the drain region has a P-type impurity with a concentration ranging from 1E18 to 1E19 atoms/cm$^3$.

13. The method of claim 1, wherein the second LDD region is characterized by a third depth, the third depth being substantially the same as the second depth.

* * * * *